United States Patent
Burstein

(10) Patent No.: US 8,549,450 B1
(45) Date of Patent: Oct. 1, 2013

(54) METHODS AND SOFTWARE FOR DETERMINING NET BOUNDS FOR PLACING AND ROUTING

(75) Inventor: Michael Burstein, Cupertino, CA (US)

(73) Assignee: Golden Gate Technology, Inc., San Jose, CA (US)

( * ) Notice: Subject to any disclaimer, the term of this patent is extended or adjusted under 35 U.S.C. 154(b) by 128 days.

(21) Appl. No.: 13/149,230

(22) Filed: May 31, 2011

Related U.S. Application Data

(60) Provisional application No. 61/349,798, filed on May 28, 2010.

(51) Int. Cl.
*G06F 17/50* (2006.01)

(52) U.S. Cl.
USPC ........... 716/106; 716/108; 716/111; 716/113; 716/132; 716/134

(58) Field of Classification Search
USPC .................. 716/106–108, 110–113, 132–134
See application file for complete search history.

(56) References Cited

U.S. PATENT DOCUMENTS

| | | | |
|---|---|---|---|
| 6,601,226 B1 * | 7/2003 | Hill et al. | 716/113 |
| 2007/0277131 A1 * | 11/2007 | Schaeffer et al. | 716/4 |
| 2008/0216039 A1 * | 9/2008 | Furnish et al. | 716/9 |
| 2009/0307645 A1 * | 12/2009 | Buck et al. | 716/6 |

\* cited by examiner

*Primary Examiner* — Paul Dinh
(74) *Attorney, Agent, or Firm* — Andrew D. Fortney

(57) ABSTRACT

Methods and software for determining one or more boundary conditions for nets in a signal path are disclosed. The method generally includes determining an expected characteristic for at least one net in the signal path and determining a boundary characteristic for that net. Determining a boundary characteristic for the net may include multiplying the expected characteristic by a scaling factor to produce a scaled characteristic for the net, performing timing analysis of the signal path in accordance with the scaled characteristic (e.g., by calculating timing while assuming that the net has the scaled characteristic), determining if the signal path violates a timing constraint when the net has the scaled characteristic, and repeating the determination with a new scaled characteristic if timing is violated. Advantageously, maximum and/or minimum values may be determined for characteristics of signal path nets that still satisfy timing constraints.

20 Claims, 6 Drawing Sheets

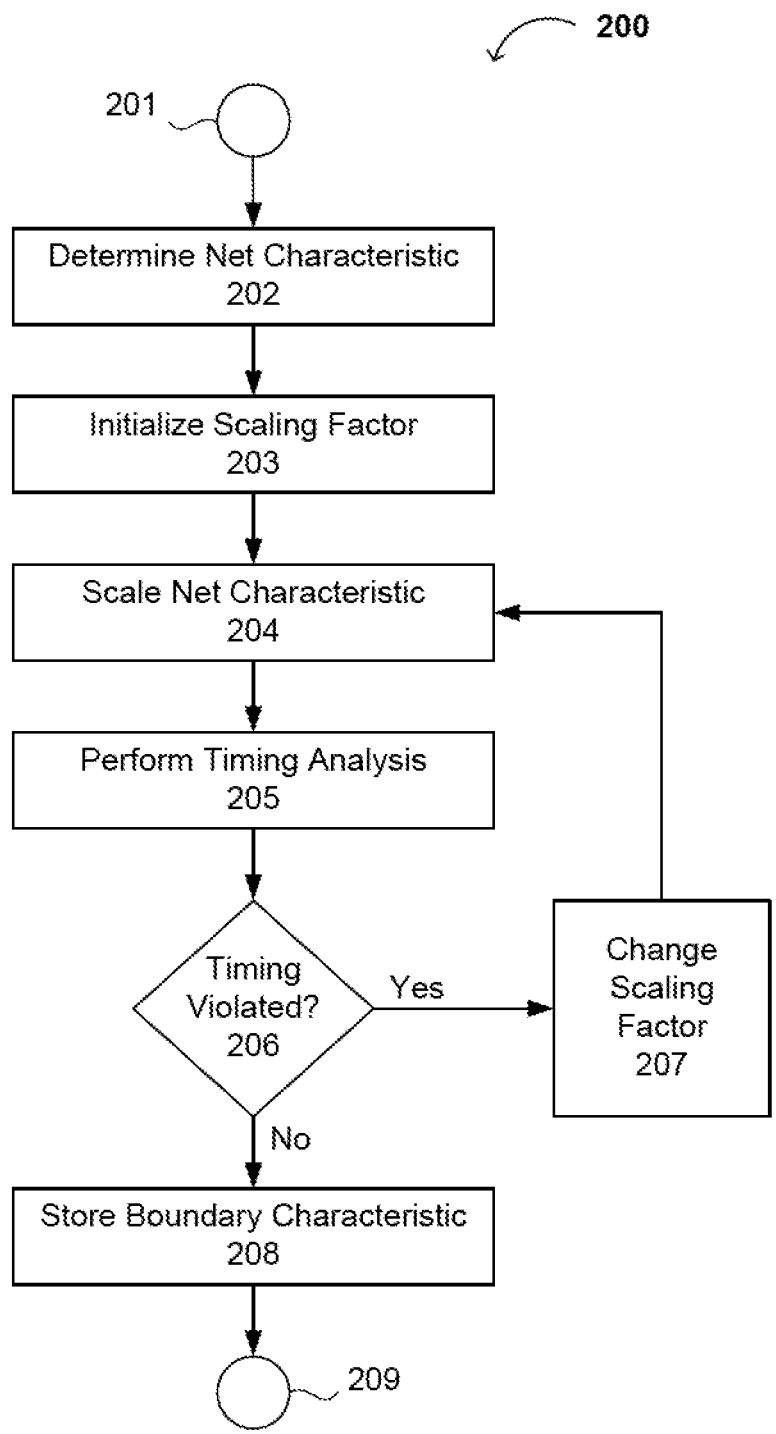

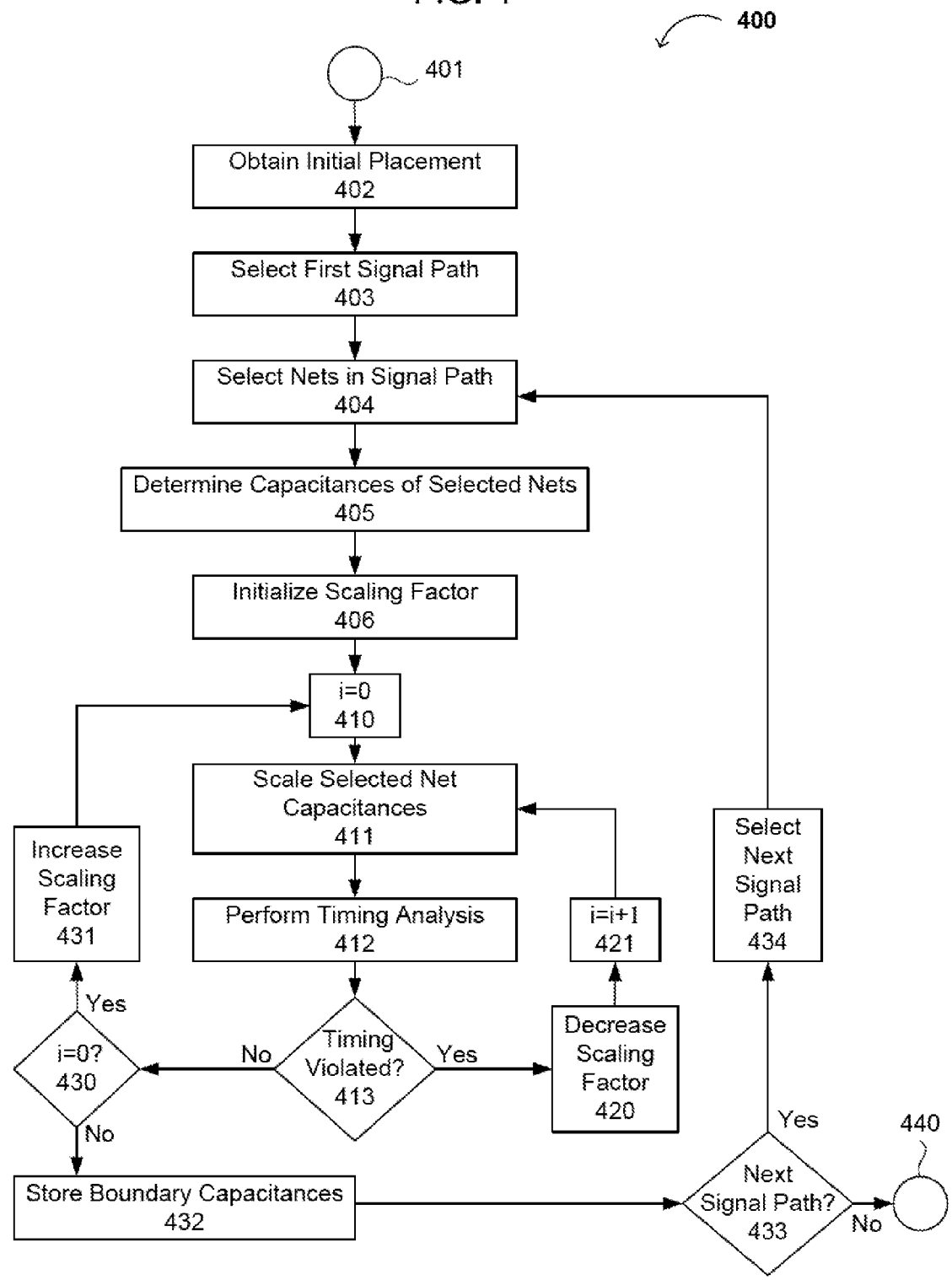

US 8,549,450 B1

METHODS AND SOFTWARE FOR DETERMINING NET BOUNDS FOR PLACING AND ROUTING

RELATED APPLICATIONS

This application claims the benefit of U.S. Provisional Patent Application No. 61/349,798, filed May 28, 2010, and incorporated herein by reference in its entirety.

FIELD OF THE INVENTION

The present invention generally relates to the field of circuit design, particularly integrated circuit (IC) design. More specifically, embodiments of the present invention pertain to methods, algorithms, software, systems, and architectures for determining boundary characteristics for nets between circuit blocks.

DISCUSSION OF THE BACKGROUND

In typical circuit design, circuit components are arranged to optimize space and/or circuit performance. Such arrangements can include the "layout" or pattern definition of each of the layers used in a semiconductor manufacturing process. For example, such layout(s) can include metal interconnect layers or metal connectivity layers that are converted to masks or reticles for use in a wafer fabrication facility that manufactures ICs (i.e., "chips").

While some circuits are designed using "custom" layout processes, others are designed using a partially or fully automated design flow. Application-Specific Integrated Circuit (ASIC) designs, as well as other functional blocks within a larger chip, such as System-On-Chip (SOC) designs, may employ custom and/or ASIC type flows on the same chip. In any event, typical ASIC flows use "place-and-route" tools for placing logic or circuit "blocks" and then "routing" or connecting the interface signals between the blocks. Such routing between circuit blocks is typically done using one or more metal connectivity layers for each signal path. In most modern ASIC designs, at least five layers of metal connectivity are employed.

Referring now to FIG. 1A, a logical diagram of a typical signal path is shown. A signal path generally has a plurality of circuit blocks (e.g., circuit blocks 101-105) with "nets" or wires 111-114 communicatively coupled between circuit blocks. A signal path generally has flip-flops or other state memory devices at each end of the path (e.g., circuit blocks 101 and 105), with logic gates or other logical operation circuit blocks between the flip-flops (e.g., circuit blocks 102-104). Typically, a signal path is designed and/or required to propagate a signal from a beginning flip-flop 101 to an ending flip-flop 105 during one clock pulse. Therefore, when the circuit blocks and nets of a signal path are placed and routed on an integrated circuit device, the propagation delay of the wires that form the nets must be taken into account.

In conventional place-and-route flows, circuit blocks or "cells" are first placed in desired locations and sized (e.g., had their drive strength adjusted by changing transistor sizes and/or adding buffer stages) in accordance with a projected routing and capacitive load based on these desired cell locations. Then, signals are actually routed between the circuit blocks. A standard cell is a specific design for each gate in the library. With advancements in integrated circuit fabrication processes, the routing area is becoming relatively more important than the total number of transistors used with respect to the overall area of ASIC designs. Since the majority of ASIC routing is performed automatically, standard cell sizes are generally used to support place-and-route tools. Thus, referring now to FIG. 1B, circuit blocks 101-105 may be placed into cells of integrated circuit layout 120, where the height of each cell in rows R1 through R6 is the same. Although nets 111-114 are shown as straight logical interconnections between circuit blocks 101-105, wires are typically placed on horizontal and vertical wire tracks in the layout.

After wires are placed, the timing of the signal path is generally evaluated. Typically, capacitances of the actual resultant signal paths are extracted and provided to a simulator and/or timing closure tool. If the circuit meets the timing specifications for the design, timing closure has been obtained. However, if the circuit fails timing closure, adjustments to the circuit block placement and/or routing must be done. This process must be repeated until timing closure is met, delaying the completion of the overall design. In particular, overdriven signals or signals with relatively long paths resulting from such conventional solutions are susceptible to hold time violations. The signal paths must then be re-routed and/or the cells re-sized as part of one or more iterations in order to ultimately meet the timing constraints.

Given the increasing demands on circuit designers to more quickly create chips of increasing density, decreasing wire and transistor widths, and decreasing power supply and power consumption, it is difficult to ensure optimal cell sizing in an automated place-and-route flow. Increasing the complexity, flexibility, and/or functionality of the circuitry on a chip exacerbates these challenges.

In addition, re-validating timing for each change to a placement and routing solution can be very computationally intensive. Therefore, it is desirable to provide methods for predetermining outer boundaries for signal path characteristics (e.g., capacitance of the wires) where timing constraints can still be satisfied, so that nets can be re-routed to satisfy other conditions (e.g., to solve routing congestion problems) without violating timing constraints.

This "Background" section is provided for background information only. The statements in this "Background" are not an admission that the subject matter disclosed in this "Background" section constitutes prior art to the present disclosure, and no part of this "Background" section may be used as an admission that any part of this application, including this "Background" section, constitutes prior art to the present disclosure.

SUMMARY OF THE INVENTION

Embodiments of the present invention relate to methods and software for determining one or more boundary conditions for a signal path. The signal path generally comprises a plurality of circuit blocks and combinational paths having at least one net between the circuit blocks. The method generally comprises determining an expected characteristic for each net and determining a boundary characteristic for each net. Determining a boundary characteristic for each net may include multiplying the expected characteristic by a scaling factor to produce a scaled characteristic for each net, performing timing analysis of the signal path in accordance with the scaled characteristic (e.g., by calculating timing while assuming that the net has the scaled characteristic), and determining if the signal path violates a timing constraint when the net has the scaled characteristic. If a timing violation occurs, the method includes changing the present scaling factor and repeating the steps of determining a boundary characteristic. If a timing violation does not occur, then the scaled characteristic may be stored as a boundary characteristic. The method may also include obtaining an initial placement of each of the circuit blocks of the signal path and an initial routing of each of the nets of the signal path before determining the expected characteristic (e.g., by performing a place and route operation or by loading a data file containing placement and routing information).

In an exemplary implementation, the circuit blocks comprise standard cells in an integrated circuit layout, and the nets comprise metal wires routed between the circuit blocks. The net characteristic to be analyzed is preferably the capacitance of a net (e.g., the capacitance of the wire on which the net is to be routed), although the present methods may be applied to any characteristic of the net that affects timing (e.g., length and/or resistance of the net). After boundary characteristics are determined, the method may include placing and/or moving the circuit blocks of the signal path and routing the net in accordance with the boundary characteristic (e.g., re-routing the net such that the actual or estimated capacitance is less than the boundary capacitance determined by the present method).

The step of determining the boundary characteristic is generally iterative. In one embodiment of the method, in a first iteration the scaling factor is set to an initial scaling factor. The initial scaling factor is generally greater than 1.0 (e.g., because the initial placement might be assumed to pass a timing analysis), and in one embodiment, is preferably approximately 2.0. In a further embodiment, the step of changing the scaling factor comprises reducing the scaling factor by a predetermined amount. In one embodiment, the scaling factor is reduced by approximately 0.1 in each iteration.

In a still further embodiment, if the signal path does not violate a timing constraint in the first iteration (e.g., if the signal path does not fail a timing analysis even when the net capacitance is doubled), the method may include increasing the scaling factor and repeating or iterating determining the boundary characteristic. In one implementation, increasing the present scaling factor comprises multiplying the scaling factor by the initial scaling factor (e.g., repeatedly doubling the scaling factor until the signal path fails timing analysis, in order to determine the highest possible boundary).

In another embodiment, the method includes selecting a subset of the nets of the signal path, and determining boundary characteristics for each net in the subset (e.g., by iteratively changing and testing a scaled characteristic of each net). Thus, in a further embodiment, determining boundary characteristics for each net in the subset includes multiplying an expected characteristic of each net in the subset by the (same) present scaling factor to produce scaled characteristics for each net in the subset, performing timing analysis of the signal path in accordance with the scaled characteristics for each net in the subset, and determining if the signal path violates a timing constraint when the net(s) in the subset have the scaled characteristics. If a violation occurs, the method may include changing the present scaling factor and repeating the determination of the boundary characteristics for each net in the subset. If a violation does not occur, the method may include storing the scaled characteristics for each net in the subset as the boundary characteristics for each net in the subset.

Another exemplary embodiment relates to a method of determining boundary conditions for a plurality of signal paths, including performing the method of determining boundary conditions for a signal path for each of the plurality of signal paths. Thus, the method may also include determining boundary characteristics for a subset of nets in each of the plurality of signal paths.

The methods described herein may be embodied in software as computer readable media (which may be tangible) or waveforms comprising a computer executable set of instructions. The software may further include instructions adapted to place the circuit blocks and route at least one of the nets in accordance with the determined boundary characteristic of the net (e.g., by routing the net such that it satisfies one or more routing criteria without exceeding the boundary characteristics).

In another embodiment of the software, obtaining an initial placement of each of the circuit blocks of the signal path and an initial routing of each of the nets of the signal path comprises reading and parsing an input file. The input file may comprise a Design Exchange Format (DEF) file, a GDSII file, an OASIS file, or a LEF file. Alternatively, the software may include one or more instructions for performing an initial placement and routing of cells and nets based on a netlist interface file, such as Verilog Hardware Description Language (VHDL) or Very-High-Speed Integrated Circuit (VHSIC) Hardware Description Language.

The present invention advantageously provides methods and software for determining boundary characteristics of signal path nets that still satisfy timing constraints. Thus, the nets can be re-routed to satisfy other conditions (e.g., to solve routing congestion problems) without violating timing constraints. Embodiments of the present invention are computationally efficient relative to conventional methods.

These and other advantages of the present invention will become readily apparent from the detailed description of preferred embodiments below.

BRIEF DESCRIPTION OF THE DRAWINGS

FIG. 2 is a flow chart showing an exemplary method according to the present invention.

FIG. 4 is a flow chart showing another exemplary method according to the present invention.

DETAILED DESCRIPTION

Figure 1A:
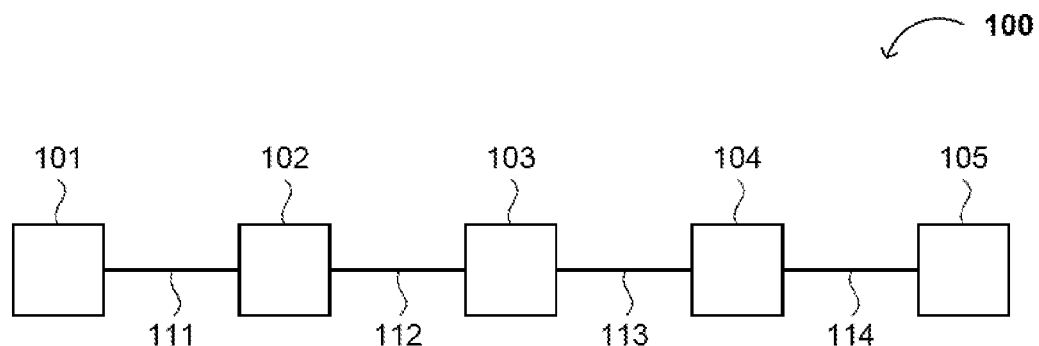
FIG. 1A is a diagram showing a logical view of a signal path.
Figure 1B:
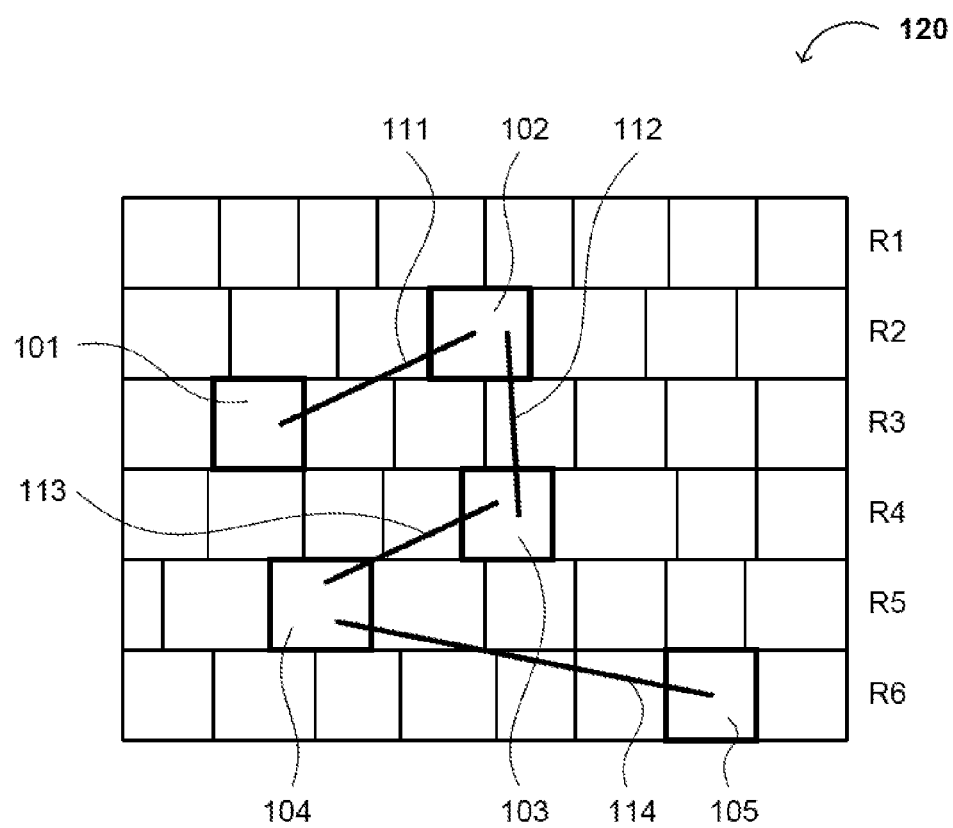
FIG. 1B is diagram showing an exemplary placement of components and nets in a signal path.

Reference will now be made in detail to various embodiments of the invention, examples of which are illustrated in the accompanying drawings. While the invention will be described in conjunction with the following embodiments, it will be understood that the description is not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams, or waveforms within a computer, processor, controller, and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, in the context of this application, the terms "net list" (or "netlist") and "hardware description" may be used interchangeably to refer to a circuit design represented in an appropriate language, such as VERILOG simulation language, Hardware Description Language (HDL) or VERILOG HDL (VHDL; VERILOG is a registered trademark of Gateway Design Automation Corporation for computer aided electrical engineering programs). Similarly, the terms "routing" and "placement" may be used together or interchangeably to refer to a placement of integrated circuit cells and/or a routing of nets between cells, which may be represented in an appropriate language such as the Design Exchange Format (DEF), LEF, GDSII, or OASIS.

The terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," but these terms are generally given their art-recognized meanings herein.

The invention, in its various aspects, will be explained in greater detail below with regard to exemplary embodiments.

An Exemplary Method for Determining a Boundary Characteristic

In one aspect, the present invention relates to a method for determining a boundary characteristic for at least one net in a signal path. The signal path generally comprises a plurality of circuit blocks or cells and combinational paths having at least one net between the circuit blocks. The boundary characteristic is generally a maximum (or minimum) value of a characteristic of the net for which the timing requirements of the signal path can be satisfied. For example, the capacitance of the wires and vias forming a net is a characteristic of the net that generally has a significant impact on the speed of propagation of a signal on the net, and thus on the timing of the signal path as a whole. Alternatively, the characteristics may include one or more parameters such as resistance, wire length, inductance, etc. It is useful to determine boundaries for such characteristics, so that cells in the signal path can be moved and nets in the signal path can be re-routed to satisfy other requirements (such as resolving routing congestion issues) without violating timing constraints.

FIG. 2 shows an exemplary method 200 for determining a boundary characteristic of a net in a signal path. The method starts at 201. At 202, an initial net characteristic is determined. The initial characteristic may be an estimated value based on the placement of the cells at each end of the net (e.g., using conventional methods for estimating capacitance, resistance, propagation delay, or other net characteristic based on cell placement before detailed routing has been performed). Alternatively, the initial characteristic may be calculated based on a detailed routing of the net. At 203, a scaling factor is initialized. The scaling factor may generally be less than one (1.0) when the method is used to determine a minimum value for the net characteristic, or greater than one (1.0) when the method is used to determine a maximum value for the net characteristic (e.g., the initial scaling value may be approximately 2.0).

At 204, the value of the net characteristic is multiplied by the scaling factor to produce a scaled net characteristic. At 205, timing analysis is performed on the signal path to determine whether timing requirements are satisfied when the net has the scaled net characteristic (e.g., to determine whether timing requirements of the signal path are satisfied when the net has, for example, a doubled capacitance or a doubled propagation delay).

At 206, the results of the timing analysis are checked. If timing requirements are violated with the present scaled capacitance, then the method proceeds to 207. At 207, the scaling factor is changed (e.g., reduced or increased), and scaling the net characteristic, performing timing analysis, and checking the results of the timing analysis are repeated to determine whether timing requirements are violated with the new scaled net characteristic. If the initial scaling factor is 2.0, then the method may, for example, comprise reducing the scaling factor at 207 by approximately 0.1 (e.g., thereby reducing the new scaled characteristic at 204 by 5% of the original net characteristic). Alternatively, the scaling factor may be reduced by fixed increments (e.g., an increment value ranging from 0.01 to 0.5, such as 0.1), a fixed percentage (e.g., 10-100%), or progressive increments or percentages. If, at 206, timing requirements are found not to be violated, then the method proceeds to 208 to store the present scaled net characteristic as a boundary characteristic, and the method is completed at 209. Thus, the signal path may be subsequently re-placed and re-routed without violating timing constraints as long as the stored boundary characteristic of the net is not exceeded (e.g., when the boundary characteristic is a maximum) or run under (e.g., when the boundary characteristic is a minimum).

Figure 3A:
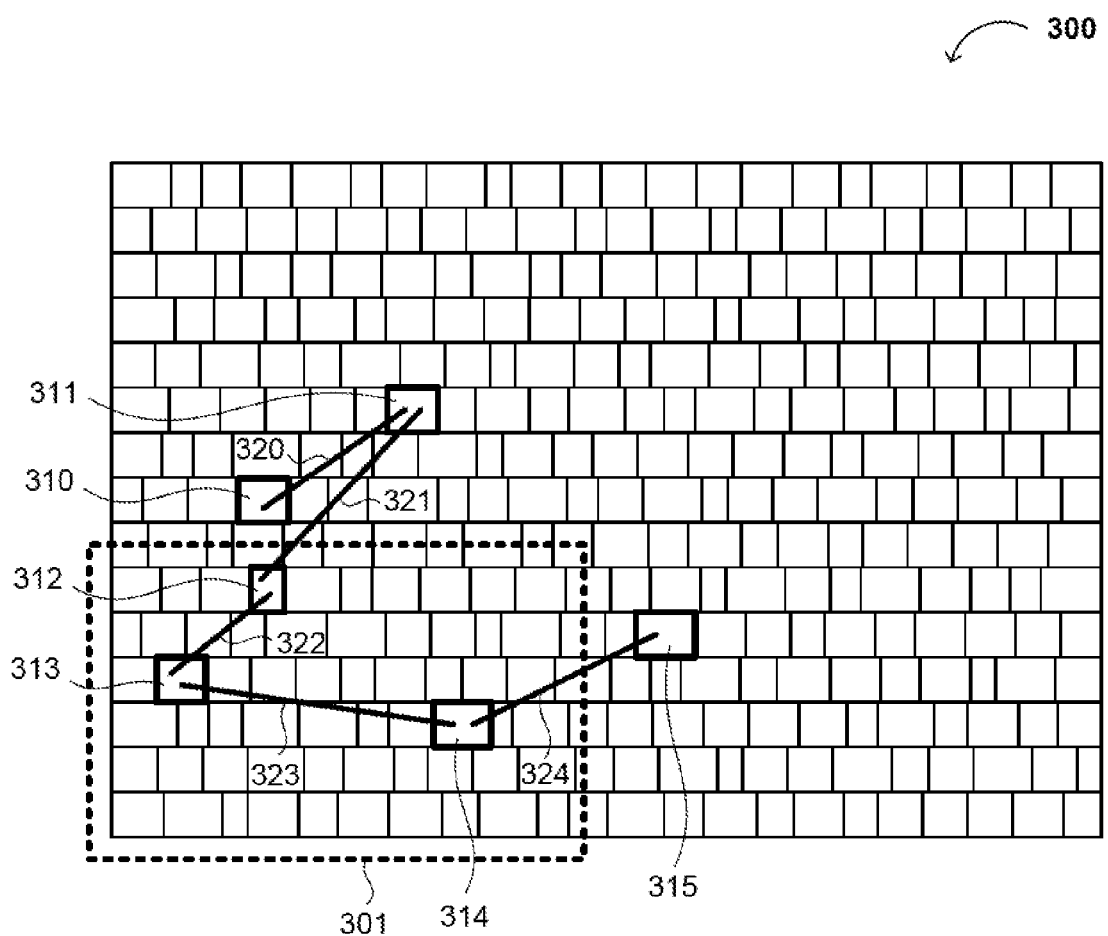
FIG. 3 is a diagram showing an exemplary placement of components and nets in a signal path in a sub-region of a semiconductor die.

The present method may be performed for one or more nets in the signal path. The circuit blocks of the signal path typically comprise standard cells in an integrated circuit layout, and the nets typically comprise metal wires routed between the circuit blocks. Referring now to FIG. 3, an exemplary integrated circuit floor plan 300 is shown. Cells 310-315 and nets 320-324 form a signal path. The method may include selecting a subset of the nets of the signal path and determining boundary characteristics for each net in the subset (e.g., by iteratively changing and testing a scaled characteristic of each net). It may be desirable to focus analysis on nets in a particular region of the integrated circuit floor plan. For example, in integrated circuit floor plan 300, region 301 contains cells 312 through 314. Nets 321-324 (but not net 320) run at least in part through region 301. Therefore, it may be desirable to determine boundary characteristics for nets 321-324 (or only the nets 322 and 323 that are entirely within region 301). Alternatively, it may be desirable to focus the analysis on the longest and shortest nets to determine a maximum boundary characteristic and minimum boundary characteristic, respectively.

Referring again to FIG. 2, step 202 may include determining initial net characteristics for each of the nets in the subset (e.g., nets 321-324). Step 204 may include multiplying the initial characteristic of each net in the subset by the same present scaling factor to produce scaled characteristics for each net in the subset. Step 205 may thus comprise performing timing analysis of the signal path in accordance with the scaled characteristics for each net in the subset. Decision step 206 then proceeds as described above, and at step 208 the boundary characteristics for each net in the subset may be stored when the timing requirements are not violated.

In some cases, the timing requirements will not be violated in a first iteration (e.g., even when the net characteristic is multiplied by the initial scaling factor, the signal path may still pass the timing analysis). In such cases, it may be desirable to increase (or decrease) the scaling factor to determine whether a larger maximum value or a smaller minimum value may be acceptable. Therefore, if a violation does not occur in the first iteration, the method may include increasing (or decreasing, as appropriate) the scaling factor and repeating the iterative steps of determining the boundary characteristic. For example, increasing the present scaling factor may include multiplying the scaling factor by the initial scaling factor. Thus, if the initial scaling factor is 2.0, for example, the method may result in repeatedly doubling the scaling factor, until the signal path fails timing analysis in order to determine the highest possible boundary.

Alternatively, the method may include linearly or progressively changing (increasing or decreasing, as appropriate) the scaling factor. The scaling factor may be linearly changed by increasing or decreasing the scaling factor by the same amount in each iteration. For example, a linear increase in the scaling factor may progress from an initial value of 1.0 to 1.1, 1.2, 1.3, etc., and a linear decrease in the scaling factor may progress from an initial value of 2.0 to 1.8, 1.6, 1.4, etc. Progressively changing the scaling factor may include exponential or logarithmic changes in the scaling factor. For example, exponentially increasing in the scaling factor may progress from an initial value of, e.g., 1.0 to 1.2, 1.6, 2.4, 4.0, etc., and exponentially decreasing the scaling factor may progress from an initial value of, e.g., 4.0 to 3.8, 3.2, 2.4, etc. Logarithmically increasing the scaling factor may progress from an initial value of, e.g., 1.0 to 1.8, 2.2, 2.4, 2.5, etc., and logarithmically decreasing the scaling factor may progress from an initial value of, e.g., 2.0 to 1.6, 1.4, 1.3, etc. Of course, other increments or progressions can be easily devised by one skilled in the art.

An Exemplary Method for Determining Boundary Capacitances

An important characteristic in the timing analysis of integrated circuit wires is their capacitance. In addition, it is often desirable to re-place and re-route several signal paths at once to overcome routing constraints (e.g., to relieve routing congestion). FIG. 4 shows an exemplary method 400 for determining boundary capacitances for subsets of nets in a plurality of signal paths.

The method begins at 401 and proceeds at 402 to determine an initial placement of each of the circuit blocks of a plurality of signal paths and optionally, an initial routing of each of the nets of the signal paths. The initial placement may be determined by performing a place operation (e.g., using a place and route tool). Alternatively, the initial placement may be determined by loading a data file containing placement and/or routing information. The data file may, for example, comprise a Design Exchange Format (DEF) file produced by a physical design software application or package, which may or may not include within it software adapted to perform the present method.

Figure 5:
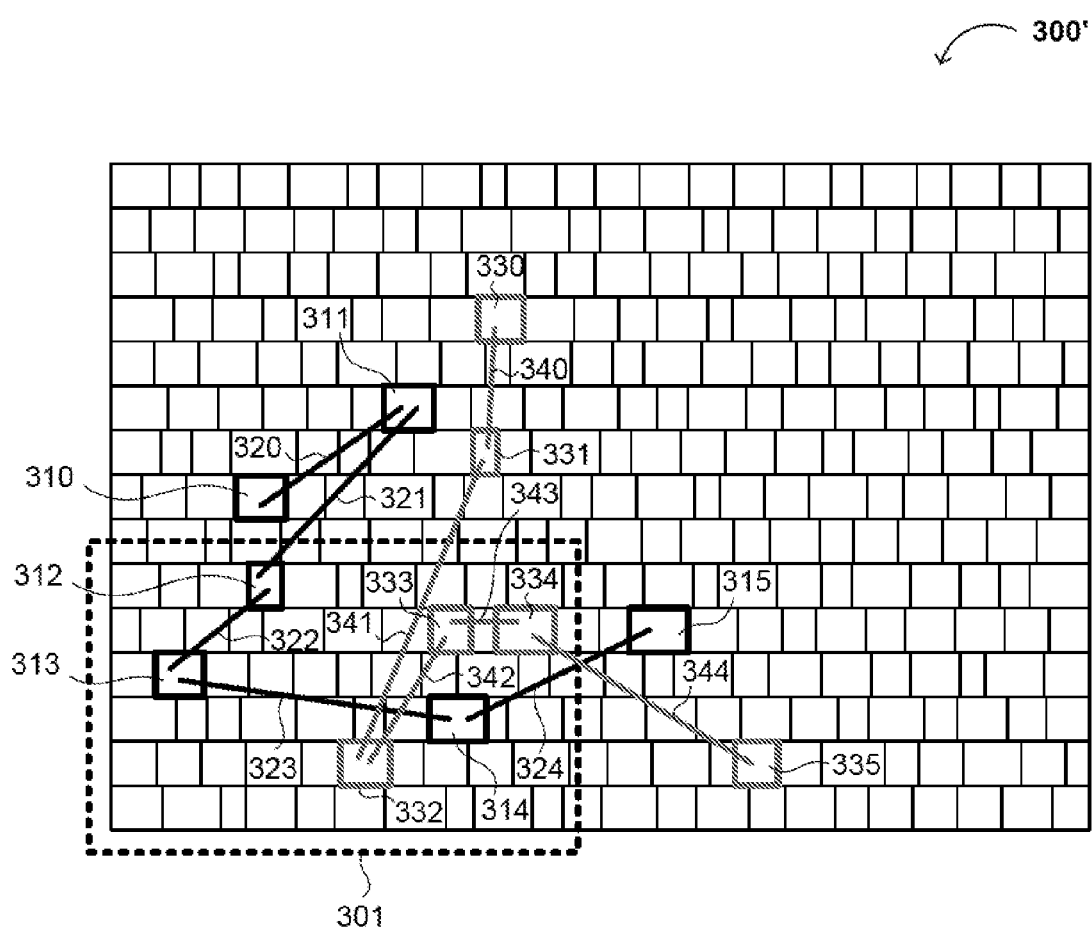
FIG. 5 is a diagram showing and exemplary placement of components and nets in multiple signal paths in a sub-region of a semiconductor die.

At 403, a first signal path is selected. Referring now to FIG. 5, integrated circuit floor plan 300' is shown. The present method may be adapted to determine boundary capacitances for nets and/or signal paths within a particular region of a floor plan. Thus, floor plan 300' may have region 301 with at least a first signal path (including cells 310-315 and nets 320-324) and a second signal path (including cells 330-335 and nets 340-344). Therefore, referring again to FIG. 4, the method may include selecting one of these signal paths at 403.

At 404, a subset of the nets in the selected signal path may be selected. Thus, referring again to FIG. 5, nets 321-324 (or, alternatively, each of the longest and shortest nets) may be selected from the first signal path. At 405, an initial capacitance of each net in the subset is determined. As described herein, the initial capacitances may, for example, be an estimated value based on the placement of the cells at each end of the net (e.g., using conventional methods for estimating capacitance based on cell placement before detailed routing has been performed), a calculated value based on a detailed routing of the net, or the resistivity of the net. Alternatively, an initial resistance may be determined. At 406, a scaling factor is initialized. For example, the scaling factor may be set to 2.0 or other value (as disclosed herein).

At 410, an iteration count (i) may be initialized to represent a first iteration with the present starting scaling factor. At 411, the values of the estimated or otherwise predetermined net capacitances are multiplied by the scaling factor to produce scaled capacitances for each net in the subset (e.g., nets 321-

324). At 412, timing analysis is performed on the signal path to determine whether timing requirements are satisfied when the nets in the subset have the respective scaled capacitance values (e.g., to determine whether timing requirements of the signal path are satisfied when the net has, for example, a doubled capacitance).

At 413, the results of the timing analysis are checked. If timing requirements are violated with the present scaled capacitances, then the method proceeds to 420. At 420, the scaling factor is reduced. For example, in an exemplary implementation the scaling factor may be reduced by 0.1 so that the new scaled capacitance at 411 will be reduced by 5% of the initially determined capacitance. It will be recognized, though, that a person skilled in the art may choose a reduction value based, for example, on the granularity or accuracy desired in the boundary characteristic. Thus, a larger step size may result in less computations (e.g., requiring fewer iterations to arrive at an acceptable boundary capacitance), but a larger margin between the calculated boundary capacitance and a more "optimum" boundary capacitance. Similarly, a smaller step size may result in more computations, but a smaller margin between the calculated boundary capacitance and the "optimum" value. At 421, the iteration count is incremented, and the selected net capacitances are scaled and timing analysis performed and checked again to determine whether timing requirements are violated with the new scaled net characteristic.

If, at 413, timing requirements are found not to be violated, then the method proceeds to 430 to determine whether this is the first iteration of 410-413 for a starting scaling factor (e.g., no previous iteration for this set of nets has failed the timing analysis). If it is the first iteration, the method proceeds to 431 to increase the scaling factor. Increasing the scaling factor may, for example, comprise multiplying the scaling factor by the initial scaling factor (e.g., doubling the scaling factor if the initial scaling factor was 2.0). Alternatively, the scaling factor may be increased by fixed increments (e.g., an increment value ranging from 0.01 to 0.5, such as 0.1), a fixed percentage (e.g., 10-100%), or progressive increments or percentages. The method then repeats scaling the net capacitances, performing timing analysis, and checking the timing analysis to determine boundary capacitances for the nets.

If, at 430, it is determined that the present iteration is not the first iteration with the present starting scaling factor (e.g., the signal path has failed at least one previous timing analysis), the present scaled capacitances of the nets may be stored as boundary capacitances for this signal path, and the method may determine whether there are additional signal paths to process at 433.

If there are additional signal paths to process, then the method proceeds to 434, where a next signal path is selected. For example, after processing the first signal path of FIG. 5 (e.g., the signal path comprising cells 310-315 and nets 320-324), the method may proceed to process the second signal path of FIG. 5 (e.g., the signal path comprising cells 330-335 and nets 340-344). The method then repeats the sequence at 404-413 to determine boundary capacitances for at least a subset of the nets of the next signal path. If, at 433, it is determined that there are no further signal paths to process, then the method of determining boundary capacitances ends at 440.

Thus, the cells and nets of the selected signal paths may be subsequently re-placed and/or re-routed without violating timing constraints as long as the stored boundary capacitances of the nets are not exceeded. It has been shown that performing this method to determine these constrains and re-routing and re-placing within the determined constraints is much more computationally efficient than running timing analysis for each movement of each cell during the re-routing and re-placing operation.

Exemplary Software

A further aspect of the invention relates to software configured to perform the present methods. The software may be embodied in a computer readable medium or waveform comprising a computer executable set of instructions. For example, the software may be stored as executable code, machine object code components, and/or as software source code (e.g., in C, C++, Java, or any other appropriate programming language) on magnetic storage media (e.g., hard disks), flash storage, optical storage, or other tangible computer readable media, or in a computer readable waveform for transmission on a network or other medium of communication.

Figure 6:
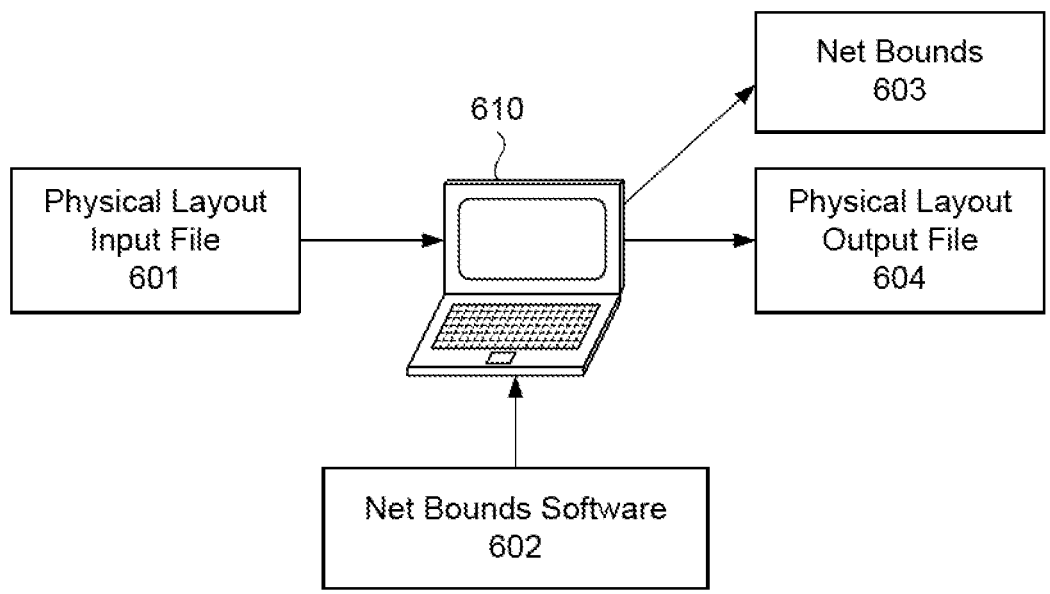
FIG. 6 is a diagram showing a system adapted for use with embodiments of the present invention.

Referring now to FIG. 6, an exemplary system employing the present software is shown. Computer 610 may load and execute net bounds software 602 implementing the present method(s). Net bounds software 602 may cause computer 610 to load an input file 601 containing an initial physical layout of an integrated circuit, including an initial placement of each of the circuit blocks of the signal paths and an initial routing of each of the nets of the signal paths. The input file 601 may be a product of an initial route and place process performed on computer 610 or may be the product of a process performed on one or more other computers and transmitted to computer 610 (e.g., by physical storage medium or by network transmission). The input file may comprise a conventional Design Exchange Format (DEF) file, a GDSII file, an OASIS file, or a LEF file.

Net bounds software 602 may then cause computer 610 to perform the methods described herein to produce net bounds 603 (e.g., containing boundary capacitances and/or other boundary characteristics for at least one of the nets of the integrated circuit). Computer 610 may also be configured to perform an additional place-and-route operation in accordance with the net bounds 603 to produce a physical layout output file 604. The physical layout output file 604 may also comprise a conventional DEF, GDSII, OASIS, or LEF file, or may comprise any other file or data structure suitable for providing placement and routing information for an integrated circuit. In this fashion, a conventional ASIC type design flow including synthesis can be adapted for placement of cells and routing of signal paths between the cells in accordance with embodiments of the present invention.

Further examples of suitable systems, tools and/or methods in which the present invention is generally applicable include those described in, e.g., U.S. Pat. Nos. 6,080,201 and 5,798,936, the relevant portions of which are each incorporated herein by reference, and those commercially available from place-and-route software vendors such as Cadence Design Systems (e.g., the SILICON ENSEMBLE™, SILICON ENSEMBLE-PKS™, FIRST ENCOUNTER™, and NANO ENCOUNTER™ tools), Silicon Valley Research, Inc. (e.g., the QIC/APR™, GARDS™, SC™ and FLOORPLACER™ tools), Synopsys (e.g., the CHIP ARCHITECT™, DESIGN COMPILER™, and FLOORPLAN COMPILER™ tools) and Mentor Graphics (e.g., the AUTOCELLS™ tool).

CONCLUSION/SUMMARY

Thus, the present invention provides methods and software for determining one or more boundary conditions for a signal path. The present invention advantageously provides for determining maximum and/or minimum values for characteristics of signal path nets that still satisfy timing constraints.

Thus, the nets can be re-routed to satisfy other conditions (e.g., to solve routing congestion problems) without violating timing constraints. Embodiments of the present invention are computationally efficient relative to conventional methods.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of determining at least one boundary condition for a signal path, said signal path comprising a plurality of circuit blocks and combinational paths having at least one net between said circuit blocks, said method comprising:
   determining an expected characteristic for each of said at least one net; and
   determining a boundary characteristic for each of said at least one net, including:
     multiplying said expected characteristic by a present scaling factor to produce a scaled characteristic for each of said at least one net,
     using a computer or data processing system, performing timing analysis of said signal path in accordance with said scaled characteristic, and
     determining if said signal path violates a timing constraint when said at least one net has said scaled characteristic and, if said signal path violates said timing constraint, then changing said present scaling factor and repeating said step of determining said boundary characteristic; and
   when said signal path does not violate said timing constraint, storing said scaled characteristic as said boundary characteristic.

2. The method of claim 1, wherein said expected characteristic is an expected capacitance of said at least one net, and said boundary characteristic is a boundary capacitance for said at least one net.

3. A method of placing and routing, comprising:
   performing the method of claim 1; and
   placing said circuit blocks and muting said at least one net in accordance with said boundary characteristic of said at least one net.

4. The method of claim 1, wherein said present scaling factor is an initial scaling factor in a first iteration of determining said boundary characteristic.

5. The method of claim 4, wherein said initial scaling factor is greater than 1.0.

6. The method of claim 5, wherein changing said present scaling factor comprises reducing said present scaling factor by a predetermined value.

7. The method of claim 4, wherein determining said boundary characteristic further comprises, if said signal path does not violate said timing constraint in said first iteration, increasing said present scaling factor and repeating determining said boundary characteristic.

8. The method of claim 7, wherein increasing said present scaling factor comprises multiplying said present scaling factor by said initial scaling factor, wherein said initial scaling factor is greater than 1.0.

9. The method of claim 1, wherein said circuit blocks comprise standard cells in an integrated circuit layout and said at least one net comprises metal wires routed between said circuit blocks.

10. The method of claim 1, wherein said at least one net comprises a plurality of nets, and the method further comprises selecting a subset of said plurality of nets and determining boundary characteristics for each net in said subset, wherein determining boundary characteristics for each net in said subset comprises:
   multiplying said expected characteristic of each net in said subset by said present scaling factor to produce scaled characteristics for said each net in said subset,
   performing timing analysis of said signal path in accordance with said scaled characteristics for each net in said subset, and
   determining if said signal path violates a timing constraint when each net in said subset has said scaled characteristics and, if said signal path violates said timing constraint, then changing said present scaling factor and repeating determining said boundary characteristic.

11. A method of determining boundary conditions for a plurality of signal paths, comprising performing the method of claim 1 for each of said plurality of signal paths.

12. A non-transitory computer readable medium comprising a tangible, computer executable set of instructions adapted to determine boundary conditions for a signal path, said signal path comprising a plurality of circuit blocks and combinational paths having at least one net between said circuit blocks, said instructions including:
   obtaining an initial placement of each of said circuit blocks of said signal path and an initial routing of each of said at least one net of said signal path;
   determining an expected characteristic for each of said at least one net; and
   determining a boundary characteristic for each of said at least one net by iteratively:
     multiplying said expected characteristic by a present scaling factor to produce a sealed characteristic for said at least one net,
     performing timing analysis of said signal path in accordance with said scaled characteristic,
     determining if said signal path violates a timing constraint when said at least one net has said scaled characteristic and, if said signal path violates said timing constraint, then changing said present scaling factor and repeating determining said boundary characteristic; and
   when said signal path does not violate said timing constraint, storing said scaled characteristic as said boundary characteristic.

13. The medium of claim 12, wherein said expected characteristic is an expected capacitance of said at least one net, and said boundary characteristic is a boundary capacitance for said at least one net.

14. The medium of claim 12, further comprising instructions adapted to place said circuit blocks and route each of said at least one net in accordance with said boundary characteristic.

15. The medium of claim 12, wherein changing said present scaling factor comprises reducing said present scaling factor by a predetermined amount.

16. The medium of claim 12, wherein said step of determining said boundary characteristic further comprises, if said signal path does not violate said timing constraint in said first iteration, increasing said present scaling factor and repeating said step of determining said boundary characteristic.

17. The medium of claim 16, wherein said initial scaling factor is greater than 1.0, and increasing said present scaling factor comprises multiplying said present scaling factor by said initial scaling factor.

18. The medium of claim 17, further comprising instructions adapted to produce a data structure comprising boundary characteristics for a plurality of said nets.

19. The medium of claim 18, further comprising selecting a subset of said plurality of nets and determining boundary characteristics for each net in said subset, wherein determining boundary characteristics for each net in said subset comprises:

- multiplying an expected characteristic of each net in said subset by the same present scaling factor to produce scaled characteristics for each net in said subset,
- performing timing analysis of said signal path in accordance with said scaled characteristics for each net in said subset, and
- determining if said signal path violates a timing constraint when said nets in said subset have said scaled characteristics and, if said signal path violates said timing constraint, then changing said present scaling factor and repeating said step of determining said boundary characteristic.

20. The medium of claim 12, further comprising instructions adapted to determine boundary conditions for at least one additional signal path.

* * * * *